(12) United States Patent
Ju

(10) Patent No.: US 6,817,094 B2
(45) Date of Patent: Nov. 16, 2004

(54) METHOD OF MAKING AN ELECTRICAL CONNECTOR

(76) Inventor: Ted Ju, No. 15, Wu Shiunn St., An Leh District, Keelung City (TW)

(*) Notice: Subject to any disclaimer, the term of this patent is extended or adjusted under 35 U.S.C. 154(b) by 0 days.

(21) Appl. No.: 10/292,452

(22) Filed: Nov. 13, 2002

(65) Prior Publication Data

US 2004/0088856 A1 May 13, 2004

(51) Int. Cl.⁷ ............................................. H01R 43/00
(52) U.S. Cl. ............................. 29/884; 29/842; 29/874; 29/876; 174/267; 439/81
(58) Field of Search .................... 29/876, 874, 884, 29/830, 832, 840, 842, 843; 439/66, 67, 81; 228/180.22, 248.1, 180.2, 175; 361/767, 768, 371; 174/260, 263, 266

(56) References Cited

U.S. PATENT DOCUMENTS 5,195,237 A * 3/1993 Cray et al. .................... 29/838
5,542,174 A * 8/1996 Chiu ............................ 29/840
5,675,889 A * 10/1997 Acocella et al. ............. 29/830
5,796,590 A * 8/1998 Klein ..................... 228/180.21
5,813,115 A * 9/1998 Misawa et al. ............... 29/832

* cited by examiner

Primary Examiner—Minh Trinh
(74) Attorney, Agent, or Firm—Bacon & Thomas

(57) ABSTRACT

An electric connector and IC tin ball shaping and fixing manufacturing method is used in welding portions of terminals of one of an electric connector, IC and other electronic elements. A tin film is covered on a bottom of the ball grid array seat; wherein the tin film is formed by connecting a plurality of round small tin pieces with respect to the terminals, and a periphery of the small tin pieces being enclosed by slender connecting portions the ball grid array seat is melt so that the small tin pieces of the tin film weld as tin liquid, then the slender connecting portions will break and the small tin pieces are connected as a tin ball; thereby, the liquid tin ball will enclose the welding portion of the terminal. Finally the tin balls is cooled and condensed and then combined to the welding portions of the terminals.

4 Claims, 6 Drawing Sheets

METHOD OF MAKING AN ELECTRICAL CONNECTOR

BACKGROUND OF THE INVENTION (a) Field of the Invention

The present invention relates to welding methods of tin balls, and particularly to a electric connector and IC tin ball shaping and fixing manufacturing method.

(b) Description of the Prior Art

Conventionally, electric connectors, CPUs, chips, zero insertion electric connector or electric elements are welded to a circuit board. A plurality of terminals embedding holes are punched on a circuit board for embedding a plurality of terminals. Then the terminals are welded and fixed by tin material. This way is not preferred for terminals with a larger number of pins and with slender pins. Therefore, it is not adapted in the current electronic technology. To improve the defects in the prior art, the bottom of the terminals are combined with tin balls which are then welded to a circuit board.

However, the tin balls are adhered to a circuit board by various ways, for example, the welding portion of a terminal is formed with two copper clips or FIGS. 10 and 11, the welding portion 101 of a terminal 10 is formed as a plane and welding assisting agent 102 is sued in welding (referring to FIG. 12). Therefore, the manufacturer must prepare several producing lines for these tedious works so that the costs in manufacturing and repair are high. Moreover, the forms of the terminals are fixed and can not be designed as desired.

For the manufacturing method that the plan welding portion of a terminal 10 is combined with melted tin ball 20 using welding assisting agent (referring to FIGS. 10 and 11), the welding portion 101 of the terminal 10 has a plane structure so that the welding assisting agent can be printed upon the welding portion 101. If the welding portion has a needle shape or an embedded shape, the welding portion is not suitable for printing the welding assistant agent. Therefore, the prior art is not a preferred way and can not be used in various terminal structure.

SUMMARY OF THE INVENTION

Accordingly, the primary object of the present invention is to provide an electric connector and IC tin ball shaping and fixing manufacturing method used in welding portions of terminals of one of an electric connector, IC and other electronic elements so that the terminal can be welded to the tin balls of the ball grid array seat. The manufacturing method comprising: select a ball grid array seat, wherein the internal of the ball grid array seat has been embedded with terminals and a bottom of each terminal has a terminal welding portion; covering a tin film on a bottom of the ball grid array seat; wherein the tin film is formed by connecting a plurality of round small tin pieces with respect to the terminals, and a periphery of the small tin pieces being enclosed by slender connecting portions; thermally melting the ball grid array seat covered by the tin film so that the small tin pieces of the tin film melt as tin liquid, then the slender connecting portions will breaks and the small tin pieces are connected as a tin ball or like a tin ball; thereby, the liquid tin ball will enclose the welding portion of the terminal; and cooling and condensing the tin balls and then combining the tin balls to the welding portions at the bottoms of the terminals of the ball grid array seat.

The various objects and advantages of the present invention will be more readily understood from the following detailed description when read in conjunction with the appended drawing.

DETAILED DESCRIPTION OF THE PREFERRED EMBODIMENTS

Figure 1:
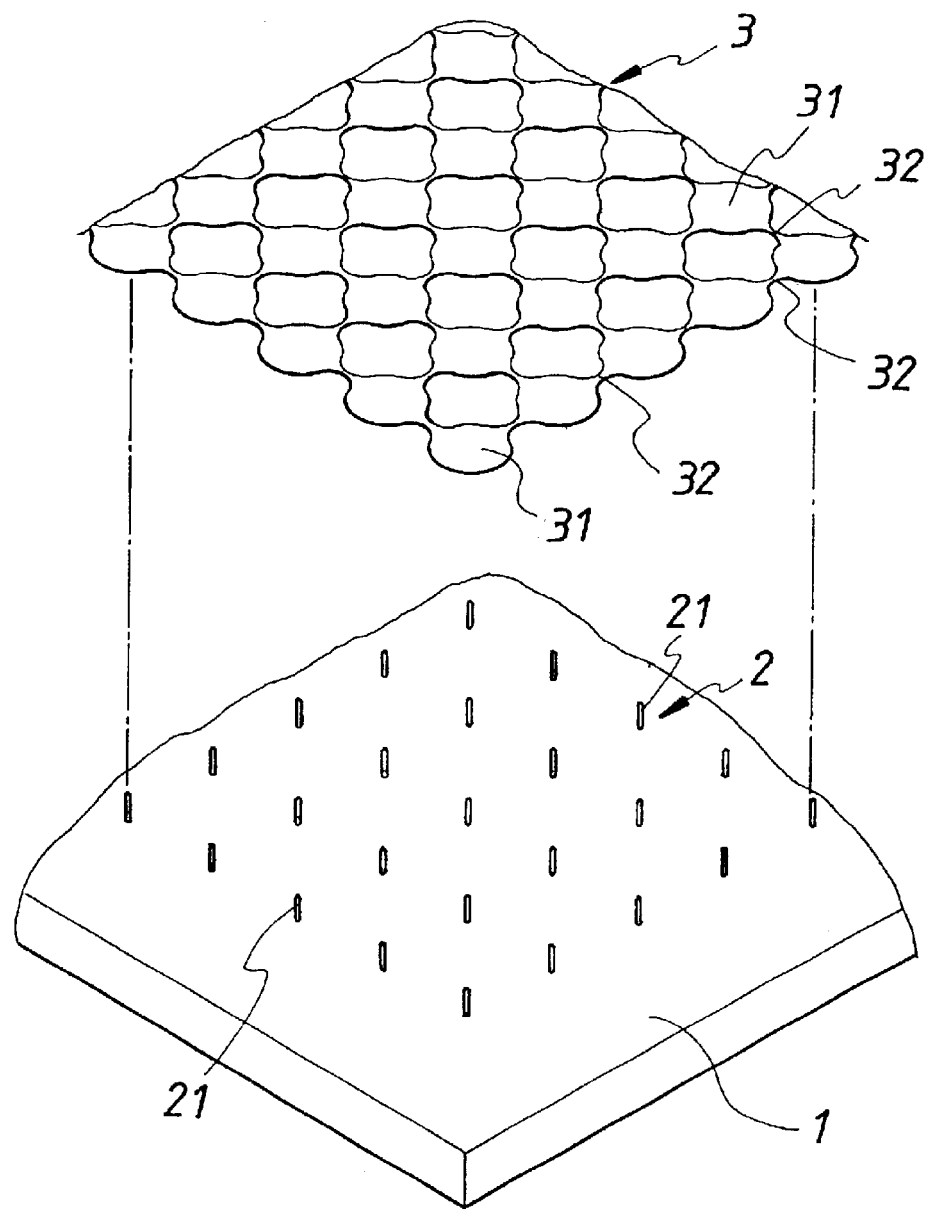
FIG. 1 is a schematic view showing the ball grid array seat and the tin film of the present invention.

Referring to Figures, the electric connector and IC tin ball shaping and fixing manufacturing method of the present invention is illustrated. The present invention can be used to the welding portion of the terminals of an electric connector, IC or other electronic element so that the terminal can be welded to the tin balls of the ball grid array seat 1. The manufacturing method will be described herein:

(a) Select a ball grid array seat 1 (referring to FIG. 1), the internal of the ball grid array seat 1 has been embedded with terminals 2 and the bottom thereof has a terminal welding portion 21.

The ball grid array seat 1 can be the bottom component of one of an electric connector, IC or other electronic elements.

Figure 2:
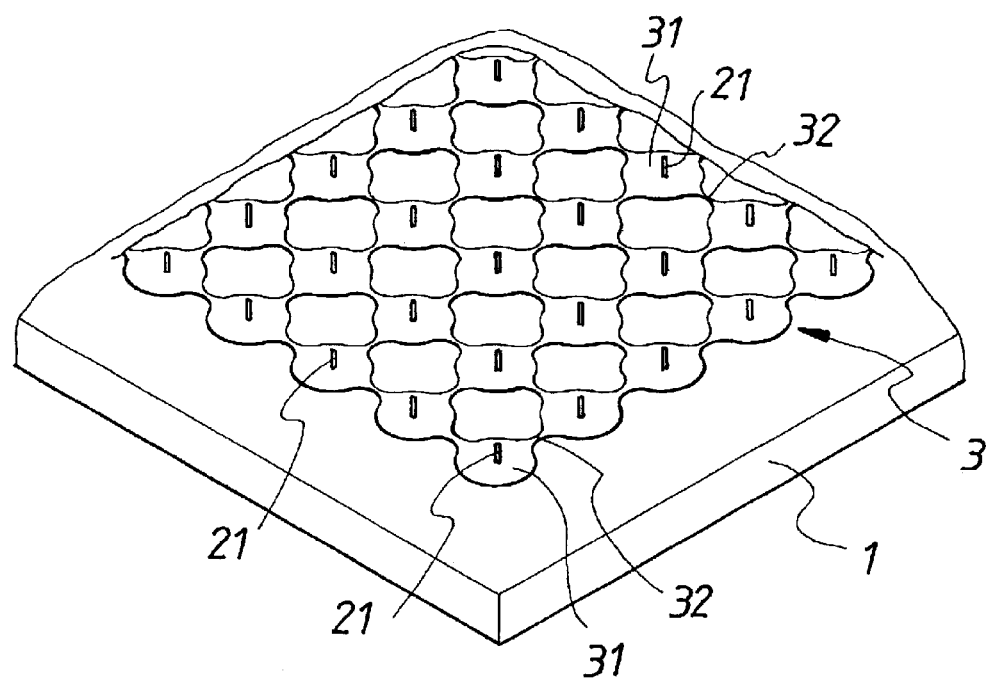
FIG. 2 is a schematic view showing that the tin film covers the ball grid array seat according to the present invention.

(b) Cover a tin film 3 on a top surface of the ball grid array seat 1, wherein the tin film 3 is formed by connecting a plurality of round small tin pieces 31 with respect to the terminals 2, and a periphery of the small tin pieces 31 being enclosed by slender connecting portions 32. The tin pieces 31 can be formed by punching so that the welding portion 32 of the terminal 2 pierces into the small piece 31 (referring to FIGS. 1 and 2).

Figure 3:
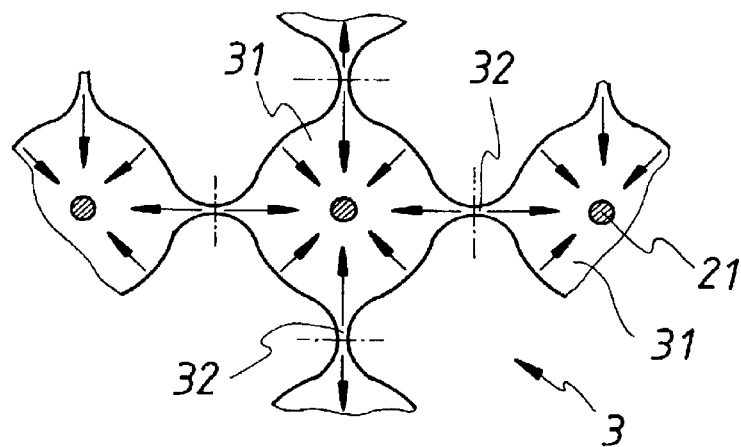
FIG. 3 is a schematic view showing that the small tin piece of the present invention is coolded and condensed.
Figure 4:
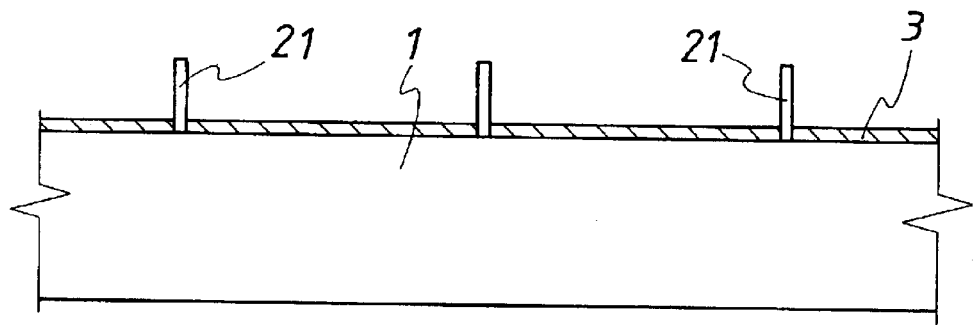
FIG. 4 is a schematic view showing that the terminal welding portion pierces into the small tin piece.
Figure 5:
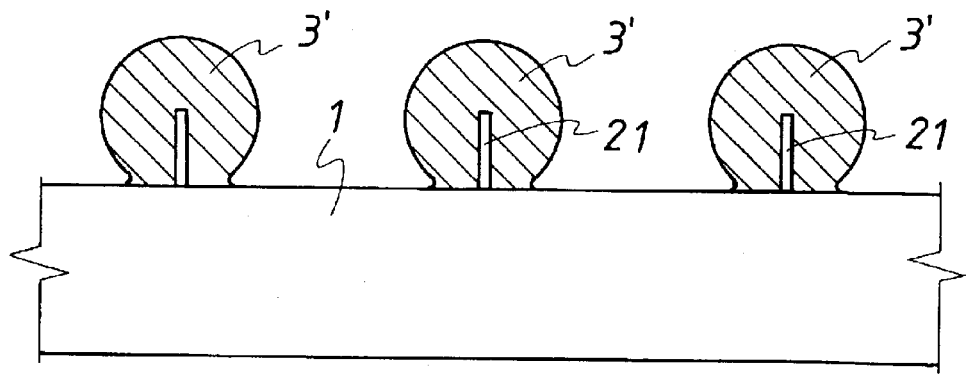
FIG. 5 is a schematic view showing that the small tin piece is melted and than condensed as a tin ball.

(c) Thermally melt the ball grid array seat 1 covered by the tin film 3 so that the small tin pieces 31 of the tin film 3 melt as tin liquid so that the slender connecting portions 32 will break and the small tin pieces 32 are connected as a tin ball 3' or like a tin ball 3', thereby, the liquid tin ball 3' will enclose the welding portion 21 of the terminal 2 (referring to FIGS. 3 and 5).

(d) Cool and condensing the tin balls 3' to be combined to the welding portions 21 at the bottoms of the terminals 2 of the ball grid array seat 1.

By above mentioned electric connector and IC tin ball shaping and fixing manufacturing method, the welding portions 21 of the terminals 2 at the bottom of an electric connector or electric elements are formed at the same time and the electric connectors, IC or other electric elements are heated and welded again.

Since in the present invention, the small tin pieces 31 of the tin film 3 are welded and then encloses the welding portions 21 at an end of the terminals 2 at a bottom of the tin film 3. No matter the welding portion 21 has a plane shape, piece shape, needle shape or embedded shapes. The welding portion 21 can be enclosed by the small tin piece 31 of the tin film 3. Then the small tin ball is cooled and condensed to be combined to the bottom of the ball grid array seat 1.

By the method of the present invention, a plurality of welding portions 21 can be used in one producing line. Thereby, the present invention provides a low cost manufacturing method with a high quality. The defects in the prior art are avoided.

By the method of the present invention that the tin film 3 is melted as tin liquid to enclose the welding portions 21 at the lower end of the terminal 2 of the ball grid array seat 1 of an electric connector, IC or electric elements, the way for fixing tin balls is not confined. By the present invention, the terminal 2 and ball grid array seat 1 may be a preferred combining way.

Figure 6:
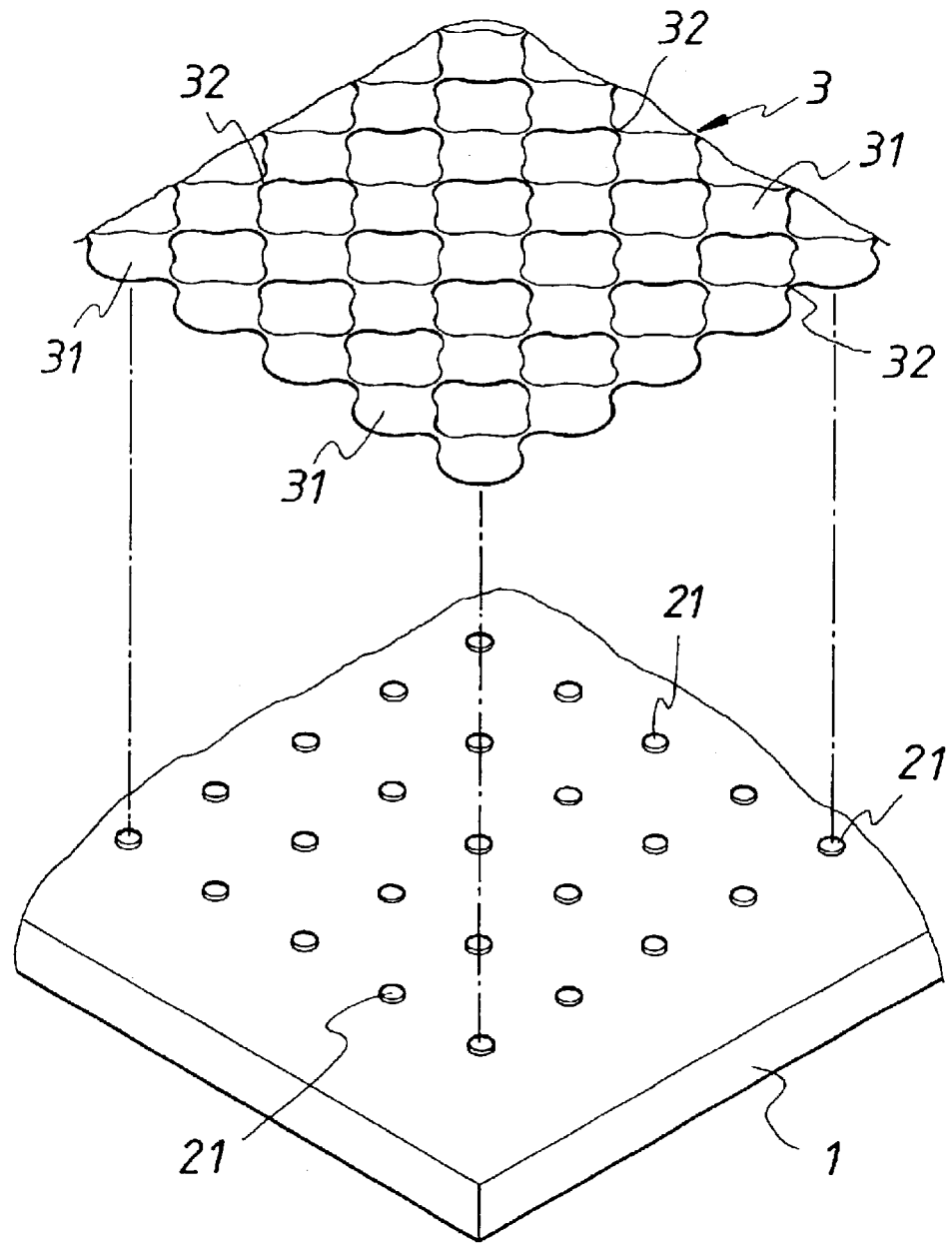
FIG. 6 is a schematic view showing another embodiment of the ball grid array seat 1 of the present invention.
Figure 7:
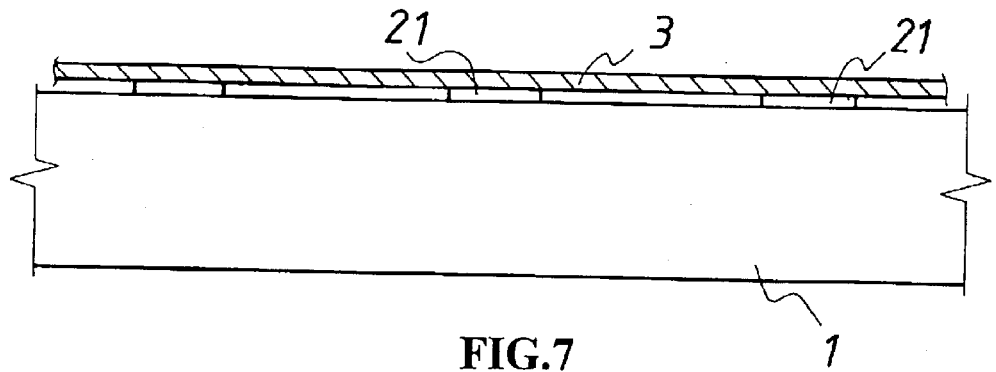
FIG. 7 is a schematic view showing that the small tin piece of the present invention enclosing the welding portion.
Figure 8:
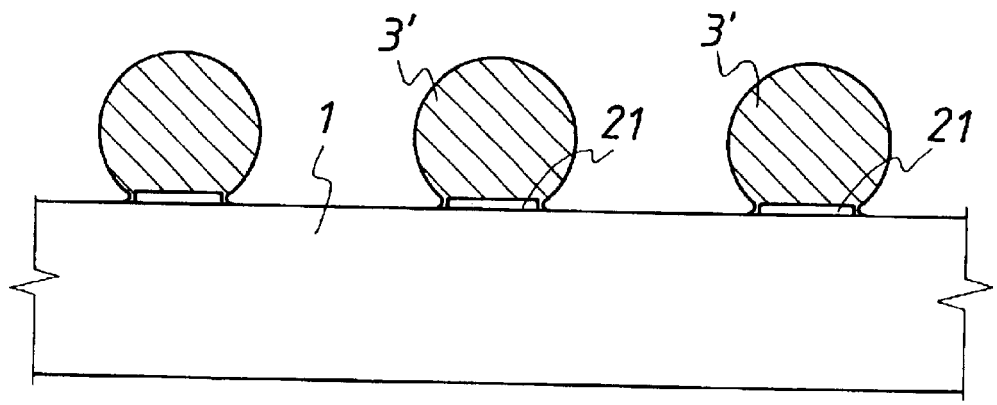
FIG. 8 is a schematic view showing that the small tin piece of the present invention is melted and then condensed as a tin ball.
Figure 9:
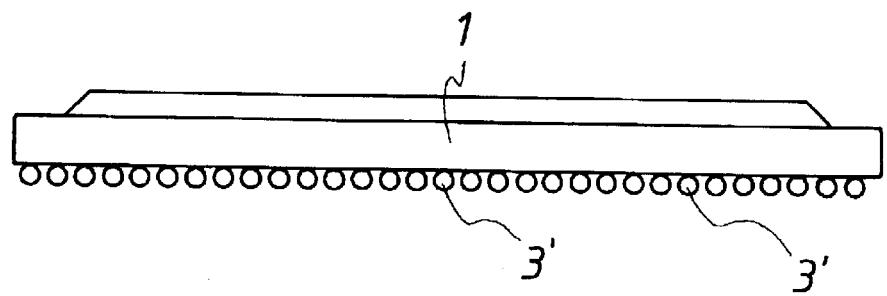
FIG. 9 is a schematic view showing that the ball grid array seat of the present invention is combined to the tin ball.
Figure 10:
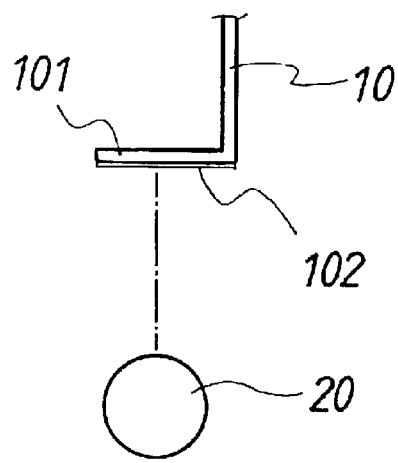
FIG. 10 is a schematic view showing that the welding assisting agent is coated upon a terminal.
Figure 11:
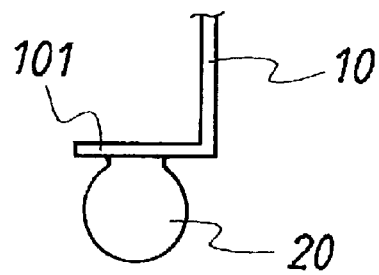
FIG. 11 is a schematic view showing a prior art tin ball being welded to a terminal.
Figure 12:
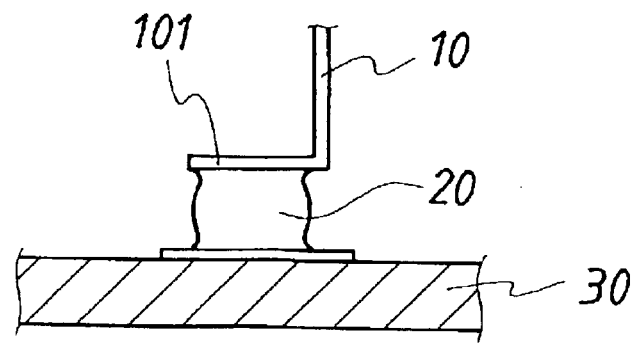
FIG. 12 is a schematic view showing that in the prior art, a terminal is welded to a circuit board.

However, in the present invention, it is not necessary that the welding portion 21 of the terminal 2 must pierce into the small tin piece 31, as shown in FIG. 6. The welding portion 21' of the terminal 2 has a piece structure. Thereby, the small tin pieces of the tin film 3 adhered to the bottom of the ball grid array seat 1' of an electric connector, IC or electric elements will enclose the welding portions 21 (referring to FIG. 7). Then, the tin film 3' is thermally melted so that the small tin pieces 31 of the tin film 3' are melted as tin liquid. Then the slender connecting portions 32 are broken at the same time so that the connecting portion 32 is condensed as a ball or ball-like tin ball 3' (referring to FIG. 8). Thus, the liquid tin ball 3' encloses the piece like welding portion 21 and then condenses.

In above mentioned method, the tin film 3 encloses the welding portion 21 at the lower end of the ball grid array seat 1, thereby, the welding portion of terminal of any form can be combined with the tin ball 3'. The various ways for combining the tin balls are simplified.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed:

1. An electric connector and IC tin ball shaping and fixing manufacturing method used in welding portions of terminals of one of an electric connector, IC and other electronic elements so that the terminal welded to tin balls of a ball grid array seat; the manufacturing method comprising:

(a) select a ball grid array seat, wherein the internal of the ball grid array seat has been embedded with terminals and a top suiface of each terminal has a terminal welding portion;

(b) covering a tin film on a bottom of the ball grid array seat: wherein the tin film is formed by connecting a plurality of round small tin pieces with respect to the terminals, and a periphery of the small tin pieces being enclosed by slender connecting portions;

(c) thermally melting the ball grid array seat covered by the tin film so that the small tin pieces of the tin film melt as tin liquid, then the slender connecting portions will break and the small tin pieces are connected as tin balls; wherein each of the tin balls will enclose the welding portion of the terminal; and (d) cooling and condensing the tin balls and then combining the tin balls to the welding portions at the bottoms of the terminals of the ball grid array seat.

2. The electric connector and IC tin ball shaping and fixing manufacturing method as claimed in claim 1, wherein the welding portion of the terminal of the ball grid array seat is piereced into one of the small tin pieces.

3. The electric connector and IC tin ball shaping and fixing manufacturing method as claimed in claim 1, wherein the welding portion is a piece structure.

4. The electric connector and IC tin ball shaping and fixing manufacturing method as claimed in claim 1, wherein the tin film is formed integrally by punching.

* * * * *